United States Patent
Han

(10) Patent No.: US 9,643,393 B2
(45) Date of Patent: May 9, 2017

(54) SEALING APPARATUS AND METHOD FOR FABRICATING DISPLAY DEVICE USING THE SAME

(71) Applicant: Samsung Display Co., LTD., Yongin, Gyeonggi-Do (KR)

(72) Inventor: Jeong-Won Han, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 89 days.

(21) Appl. No.: 14/049,546

(22) Filed: Oct. 9, 2013

(65) Prior Publication Data

US 2015/0013895 A1    Jan. 15, 2015

(30) Foreign Application Priority Data

Jul. 9, 2013  (KR) .................. 10-2013-0080269

(51) Int. Cl.
| | | |
|---|---|---|
| *B32B 38/00* | (2006.01) | |
| *H01L 51/56* | (2006.01) | |
| *H01L 51/52* | (2006.01) | |
| *H01L 27/32* | (2006.01) | |

(52) U.S. Cl.
CPC ...... *B32B 38/0008* (2013.01); *H01L 51/5246* (2013.01); *H01L 51/56* (2013.01); *B32B 2250/00* (2013.01); *H01L 27/3244* (2013.01)

(58) Field of Classification Search
CPC ............................ B32B 38/0008; H01L 51/56
See application file for complete search history.

(56) References Cited

U.S. PATENT DOCUMENTS

| | | | |
|---|---|---|---|
| 4,008,027 A * | 2/1977 | Polk .................. | B29C 45/2669 156/379.6 |
| 4,923,552 A * | 5/1990 | Fukushima et al. ....... | 156/273.7 |
| 6,284,088 B1 * | 9/2001 | Sampica et al. ........... | 156/285 |
| 2003/0178150 A1 * | 9/2003 | Lee et al. ................. | 156/580 |
| 2003/0218422 A1 | 11/2003 | Park et al. | |
| 2007/0283709 A1 * | 12/2007 | Luse ................... | F25B 21/02 62/259.2 |
| 2009/0064717 A1 | 3/2009 | Son et al. | |
| 2009/0233513 A1 * | 9/2009 | Lee et al. ................. | 445/25 |

(Continued)

FOREIGN PATENT DOCUMENTS

| | | |
|---|---|---|
| CN | 101536148 A | 9/2009 |
| CN | 102017792 A | 4/2011 |

(Continued)

OTHER PUBLICATIONS

Chinese Office Action for Application No. 201310751405.4 dated Mar. 13, 2017.

*Primary Examiner* — Daniel McNally
(74) *Attorney, Agent, or Firm* — Cantor Colburn LLP

(57) ABSTRACT

A sealing apparatus for sealing a first substrate and a second substrate by a sealant includes: a stage which supports the first and second substrates, where the sealant is interposed between the first and second substrates along edges of the first and second substrates, and the stage includes a concave portion defined to correspond to the sealant; and an optical head configured to irradiate light onto the sealant, where the first substrate and the second substrate are fixed together by the light irradiated onto the sealant such that a space surrounded by the sealant between the first substrate and the second substrate is sealed.

9 Claims, 8 Drawing Sheets

(56) References Cited

U.S. PATENT DOCUMENTS

| | | |
|---|---|---|
| 2010/0154476 A1 | 6/2010 | Becken et al. |
| 2010/0171240 A1* | 7/2010 | Singh et al. .................. 264/482 |
| 2010/0279577 A1 | 11/2010 | Joo et al. |
| 2011/0079350 A1* | 4/2011 | Lee et al. .................... 156/272.8 |
| 2011/0192525 A1* | 8/2011 | Kondo ...................... B30B 5/02 |
| | | 156/99 |

FOREIGN PATENT DOCUMENTS

| | | |
|---|---|---|
| CN | 102034682 A | 4/2011 |
| CN | 102224115 A | 10/2011 |
| CN | 102881844 A | 1/2013 |
| KR | 1020010084380 A | 9/2001 |
| KR | 1020020051153 A | 6/2002 |
| KR | 1020070078499 A | 8/2007 |
| KR | 1020070088715 | 8/2007 |
| KR | 1020090026421 | 3/2009 |
| KR | 1020090098496 | 9/2009 |
| KR | 1020100013878 A | 2/2010 |
| KR | 1020100119371 | 11/2010 |

* cited by examiner

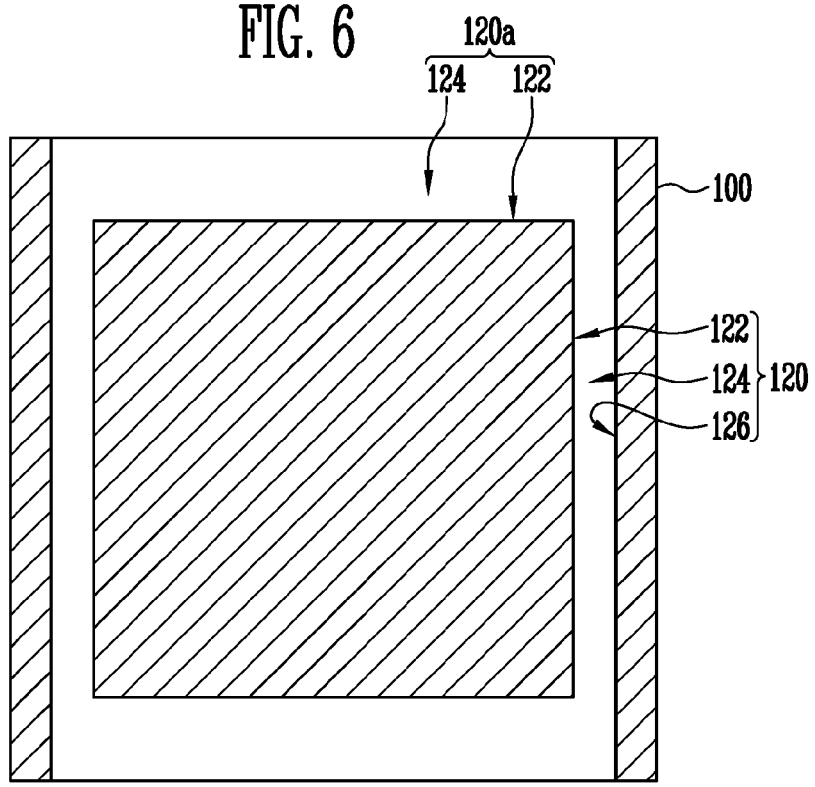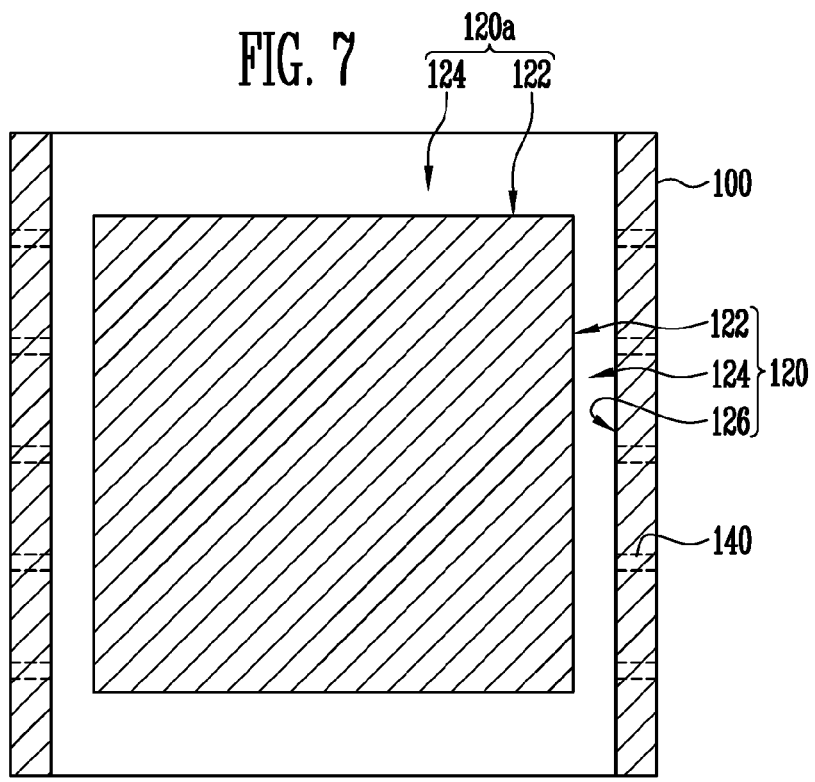

SEALING APPARATUS AND METHOD FOR FABRICATING DISPLAY DEVICE USING THE SAME

This application claims priority to Korean Patent Application No. 10-2013-0080269, filed on Jul. 9, 2013, and all the benefits accruing therefrom under 35 U.S.C. §119, the content of which in its entirety is herein incorporated by reference.

BACKGROUND

1. Field

Exemplary embodiments of the invention relate to a sealing apparatus and a method for fabricating a display device using the sealing apparatus for sealing the display device by irradiating light onto the display device.

2. Description of the Related Art

In general, an organic light emitting display includes a substrate, on which a pixel area and a non-pixel area are defined, and a container or a sealing substrate disposed opposite to the substrate to seal the pixel area of the substrate and coupled to the substrate by a sealant.

A pixel array including a plurality of pixels arranged in a matrix form and connected to scan lines and data lines is disposed in the pixel area of the substrate. Each pixel includes an organic light emitting diode including an anode electrode, a cathode electrode and an organic thin film layer disposed between the anode and cathode electrodes. The organic thin film layer may include a hole transport layer, an organic emissive layer and an electron transport layer.

When moisture or oxygen is penetrated into the organic light emitting diode, in which an organic material is included, a failure such as a decrease in emission efficiency or change in emission color may occur in the organic light emitting diode, and the cathode electrode of the organic light emitting diode, which typically include a metal, may be oxidized or exfoliated.

SUMMARY

Exemplary embodiments of the invention provide a sealing apparatus capable of preventing a bonding defect between a sealant and a substrate.

Exemplary embodiments of the invention also provide a method for fabricating a display device, in which the sealing effect and reliability of the display device can be improved through stable bonding between a sealant and a substrate.

According to an exemplary embodiment of the invention, a sealing apparatus for sealing a first substrate and a second substrate by a sealant includes: a stage which supports the first and second substrates, where the sealant is interposed between the first and second substrates along edges of the first and second substrates, and the stage includes a concave portion defined to correspond to the sealant; and an optical head configured to irradiate light onto the sealant, where the first substrate and the second substrate are fixed together by the light irradiated onto the sealant such that a space surrounded by the sealant between the first substrate and the second substrate is sealed.

In an exemplary embodiment, the concave portion may have an inner sidewall and an outer sidewall, and a plurality of ventilating openings may be defined in the outer sidewall.

In an exemplary embodiment, the concave portion may be in a step shape having an opened side.

In an exemplary embodiment, the sealant includes four portions corresponding to four sides of the first and second substrates, a portion of the concave portion corresponding to two opposing portions of the sealant includes an inner sidewall and an outer sidewall, and a portion of the concave portion corresponding to the other two opposing portions of the sealant is in a step shape having an opened sidewall.

In an exemplary embodiment, a plurality of ventilating openings may be defined in the outer sidewall of the portion of the concave portion corresponding to the two opposing portions of the sealant.

In an exemplary embodiment, the sealing apparatus may further include a moving unit configured to move the optical head along the sealant.

In an exemplary embodiment, the sealing apparatus may further include an optical oscillator configured to provide the light to the optical head.

In an exemplary embodiment, the sealing apparatus may further include a mask disposed between the stage and the optical head, where the mask includes a transmitting portion defined therein to correspond to the sealant.

In an exemplary embodiment, the sealant may include frit.

In an exemplary embodiment, the light may be laser or infrared light.

According to another exemplary embodiment of the invention, a method for fabricating a display device, the method including: providing a pixel array on a first substrate; providing a sealant on a side portion of a second substrate; disposing the second substrate on the first substrate; disposing the first and second substrates on a stage including a concave portion defined to correspond to the sealant; and bonding the sealant to the first and second substrates by irradiating light onto the sealant while moving an optical head, which emits the light, along the sealant above the stage.

In an exemplary embodiment, the pixel array may include an organic material.

In an exemplary embodiment, the light may be laser or infrared light.

In an exemplary embodiment, the providing the sealant may include applying frit in a paste state along an edge of the second substrate; and removing moisture in the frit in the paste state by firing the frit in the paste state.

BRIEF DESCRIPTION OF THE DRAWINGS

The above and other features of the invention will become more apparent by describing in detail exemplary embodiments thereof with reference to the attached drawings, in which:

FIG. 6 is a plan view illustrating a another alternative exemplary embodiment of the stage in the sealing apparatus according to the invention;

FIG. 7 is a plan view illustrating a another alternative exemplary embodiment of the stage in the sealing apparatus according to the invention;

DETAILED DESCRIPTION

Figure 1A:
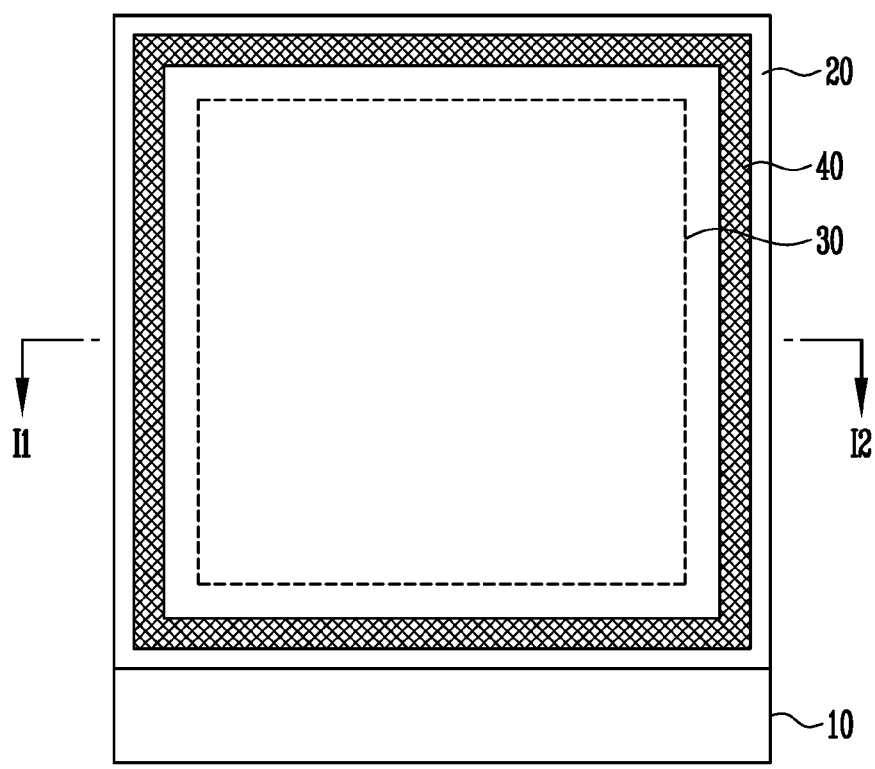
FIG. 1A is a plan view illustrating an exemplary embodiment of a display device according to the invention.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

Figure 1B:
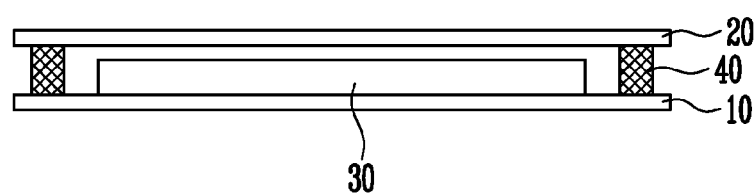
FIG. 1B is a cross-sectional view taken along line 11-12 of FIG. 1A.

FIG. 1A is a plan view illustrating an exemplary embodiment of a display device according to the invention. FIG. 1B is a sectional view taken along line 11-12 of FIG. 1A.

Referring to FIGS. 1A and 1B, the display device includes first and second substrates 10 and 20 disposed opposite to each other, a pixel array 30 interposed between the first and second substrates 20, and a sealant 40 interposed between the first and second substrates 10 and 20. In such an embodiment, the sealant 40 may be configured to surround the pixel array 30.

The first and second substrates 10 and 20 may include a transparent insulative material such as glass or plastic, for example.

The pixel array 30 includes a plurality of scan lines, a plurality of data lines, and a plurality of pixels, which is arranged substantially in a matrix form and connected to the scan lines and the data lines. In one exemplary embodiment, for example, the pixels may be disposed in areas defined by the scan lines and the data lines.

The sealant 40 is bonded to the first and second substrates 10 and 20 such that the sealant 40 seals the pixel array 30.

Figure 2:
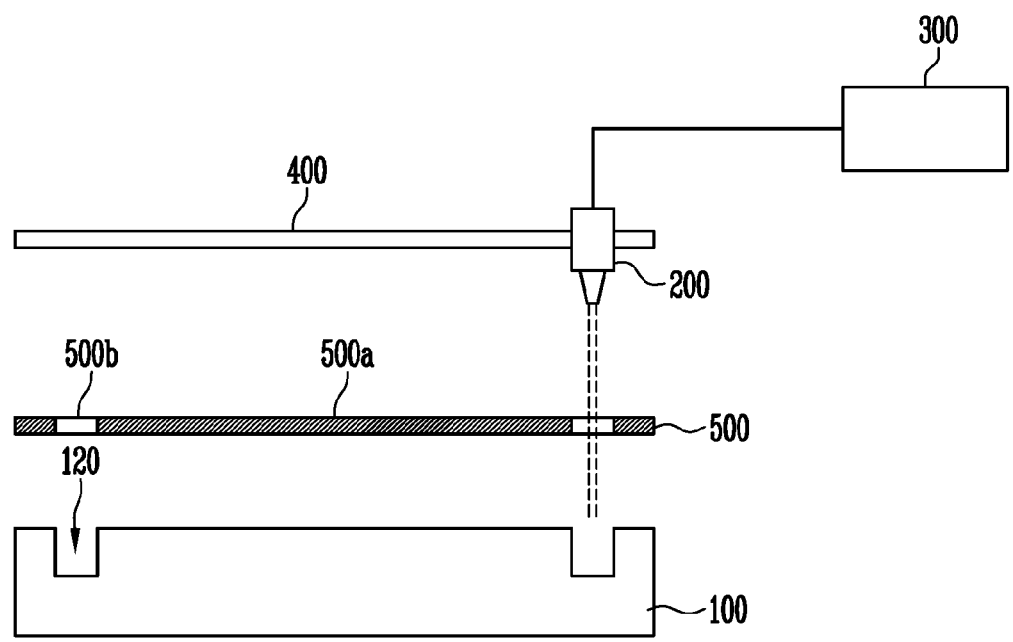
FIG. 2 is a sectional view illustrating an exemplary embodiment of a sealing apparatus according to the invention.

FIG. 2 is a sectional view illustrating an exemplary embodiment of a sealing apparatus according to the invention. The sealing apparatus will be described with reference to FIG. 2 and back to FIGS. 1A and 1B.

Referring to FIG. 2, the sealing apparatus includes a stage 100, on which a substrate is disposed, e.g., mounted, an optical head 200 disposed above the stage 100, an optical oscillator 300 configured to provide light to the optical head 200, and a moving unit 400 configured to move the optical head 200.

The optical oscillator 300 generates light such as laser or infrared light, and the optical head 200 may be configured to focus the light, e.g., through a lens, to have a predetermined width, and irradiate the focused light. The moving unit 400 may be configured to support the optical head 200 and move the optical head 200 in predetermined directions, e.g., two directions substantially perpendicular to each other.

Referring to FIGS. 1A, 1B and 2, the stage 100 may have a flat plate shape such that the first and second substrates 10 and 20 including the sealant 40 interposed therebetween is effectively mounted thereon. The stage 100 has a concave portion 120 defined thereon at positions corresponding to the sealant 40 between the first and second substrates 10 and 20.

Referring to FIGS. 1A and 1B, the sealant 40 may include four portions corresponding to four sides of the first and second substrates 10 and 20, and the concave portion 120 may be defined to correspond to the four portions of the sealant 40.

Figure 3A:
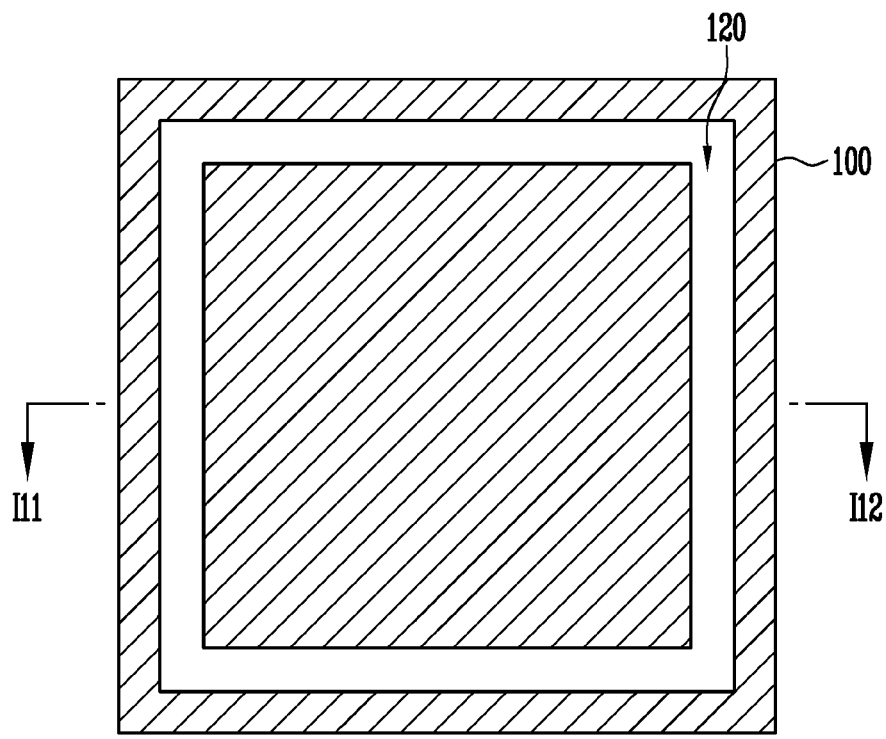
FIG. 3A is a plan view illustrating an exemplary embodiment of a stage in the sealing apparatus according to the invention.
Figure 3B:
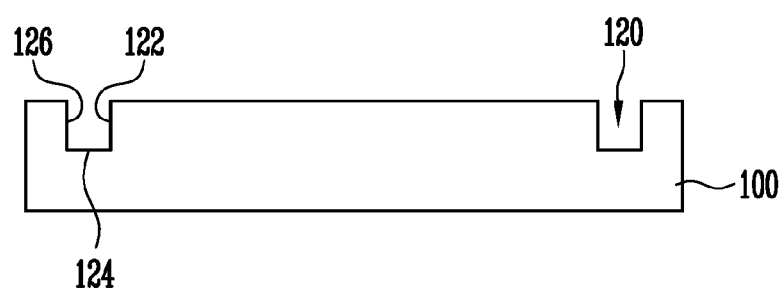
FIG. 3B is a cross-sectional view taken along line 111-112 of FIG. 3A.

FIG. 3A is a plan view illustrating an exemplary embodiment of a stage in the sealing apparatus according to the invention. FIG. 3B is a cross-sectional view taken along line 111-112 of FIG. 3A.

Referring to FIGS. 3A and 3B, the concave portion 120 is defined on a surface (e.g., an upper surface) of the stage 100 in positions corresponding to the four portions of the sealant 40.

The concave portion 120 may have opposing sidewalls, e.g., an inner side wall 122 and an outer side wall 126, and a bottom surface 124, or may have a shape of a V-shaped groove or a shape of a trench, for example. In an exemplary embodiment, the concave portion 120 may be in a loop shape along sides of the surface of the stage 100.

Figure 4A:
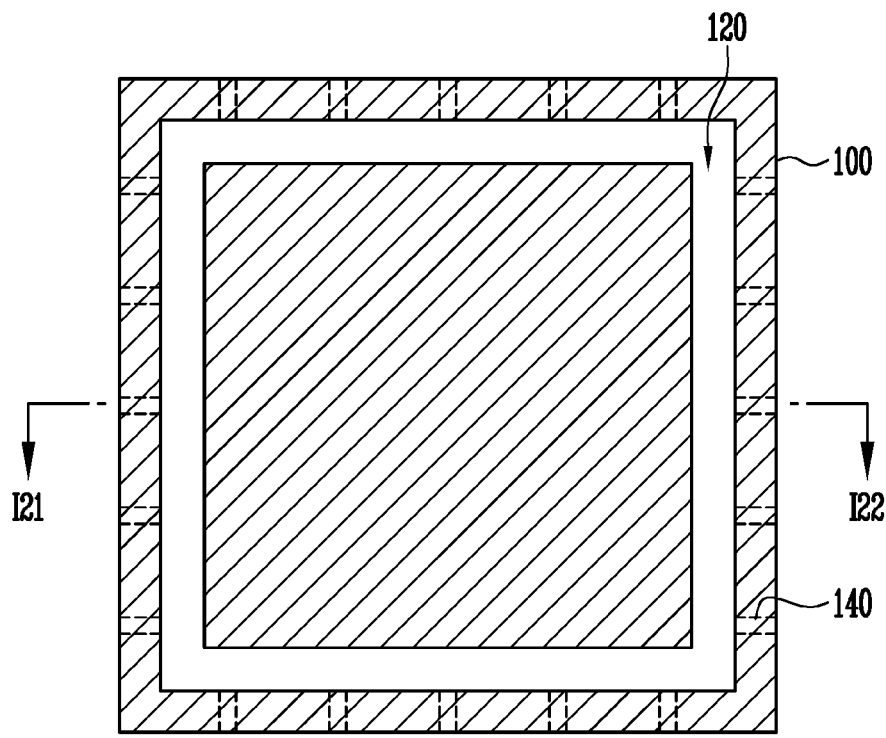
FIG. 4A is a plan view illustrating an alternative exemplary embodiment of the stage in the sealing apparatus according to the invention.
Figure 4B:
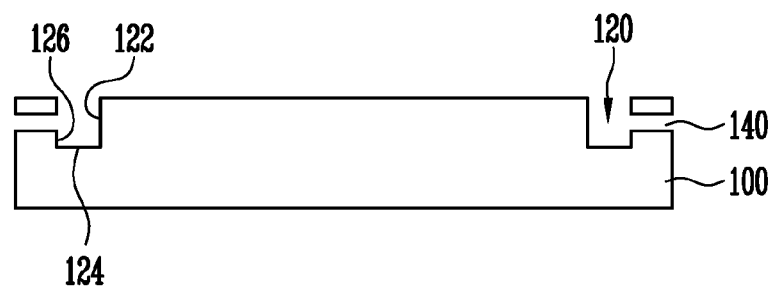
FIG. 4B is a cross-sectional view taken along line 121-122 of FIG. 4A.

FIG. 4A is a plan view illustrating an alternative exemplary embodiment of the stage 100 in the sealing apparatus according to the invention. FIG. 4B is a cross-sectional view taken along line 121-122 of FIG. 4A.

The stage 100 shown in FIGS. 4A and 4B is substantially the same as the exemplary embodiment of the stage shown in FIGS. 3A and 3B, except for a plurality of ventilating openings 140 defined in the outer sidewall 126 of the concave portion 120. The same or like elements shown in FIGS. 4A and 4B have been labeled with the same reference characters as used above to describe the exemplary embodiments of the stage shown in FIGS. 3A and 3B, and any repetitive detailed description thereof will hereinafter be omitted.

Figure 5A:
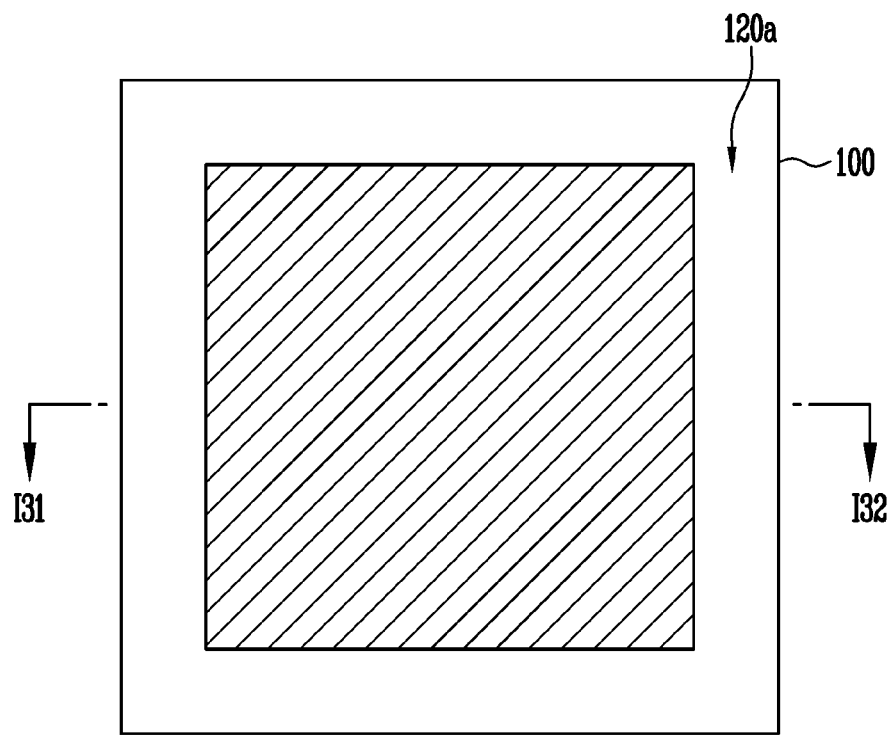
FIG. 5A is a plan view illustrating another alternative exemplary embodiment of the stage in the sealing apparatus according to the invention.
Figure 5B:
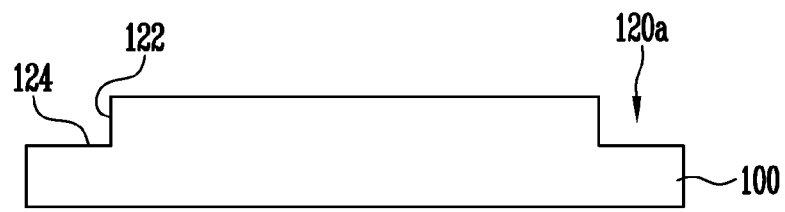
FIG. 5B is a cross-sectional view taken along line 131-132 of FIG. 5A.

FIG. 5A is a plan view illustrating another alternative exemplary embodiment of the stage 100 in the sealing apparatus according to the invention. FIG. 5B is a cross-sectional view taken along line 131-132 of FIG. 5A.

Referring to FIGS. 5A and 5B, an exemplary embodiment of the stage 100 have a concave portion 120a defined on a surface thereof in positions corresponding to the four portions of the sealant 40, and the concave portion 120a have a step shape including an opened side. In such an embodiment, the concave portion 120a has a step shape including a single sidewall, e.g., the inner side wall 122, and a bottom surface 124.

FIG. 6 is a plan view illustrating another alternative exemplary embodiment of the stage 100 in the sealing apparatus according to the invention.

Referring to FIG. 6, an exemplary embodiment of the stage 100 includes a first concave portion 120 corresponding to two portions of sealant 40, which are opposite to each other, and a second concave portion 120a corresponding to the other two portions of the sealant 40, which are opposite to each other. The first concave portion 120 has opposing sidewalls, e.g., the inner sidewall 122 and the outer sidewall 126, and a bottom surface 124. The second concave portion 120a has a single sidewall, e.g., the inner sidewall 122, and a bottom surface 124, and is in a step shape including an opened side.

FIG. 7 is a plan view illustrating another alternative exemplary embodiment of the stage 100 in the sealing apparatus according to the invention.

The stage 100 shown in FIG. 7 is substantially the same as the exemplary embodiment of the stage shown in FIG. 6, except for a plurality of ventilating openings 140 defined in an outer sidewall 126 of the concave portion 120. The same or like elements shown in FIG. 7 have been labeled with the same reference characters as used above to describe the exemplary embodiments of the stage shown in FIG. 6, and any repetitive detailed description thereof will hereinafter be omitted.

In another alternative exemplary embodiment of the invention, the sealing apparatus may further include a mask 500 disposed between the stage 100 and the optical head 200, as shown in FIG. 2. The mask 500 effectively prevents the pixel array 30 from being damaged by the light provided from the optical head 200. In such an embodiment, the mask 500 includes a shielding portion 500a, which is a portion corresponding to the pixel array 30, and a transmitting portion 500b, which is a portion corresponding to the sealant 40. In such an embodiment, the light is blocked by the shielding portion 500a and the light is transmitted through the transmitting portion 500b. The mask 500 may be provided, e.g., disposed, adjacent to the stage 100 before emitting the light.

Figure 8:
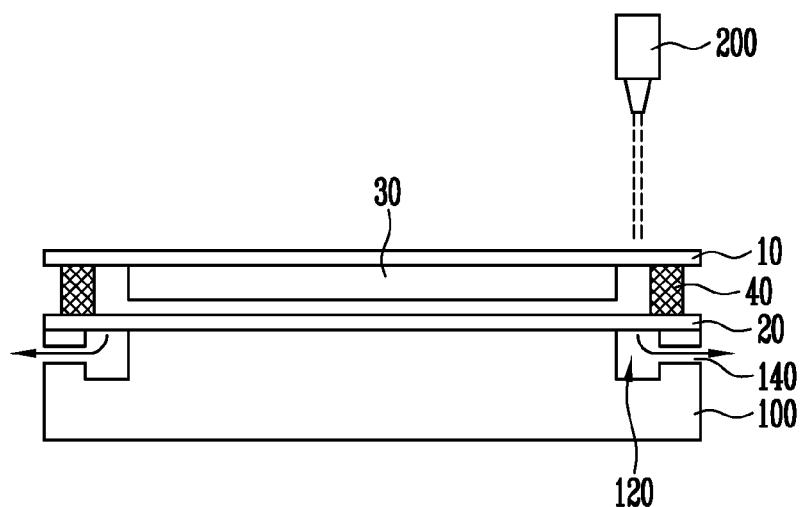
FIGS. 8 and 9 are sectional views illustrating exemplary embodiments of the sealing apparatus according to the invention.
Figure 9:
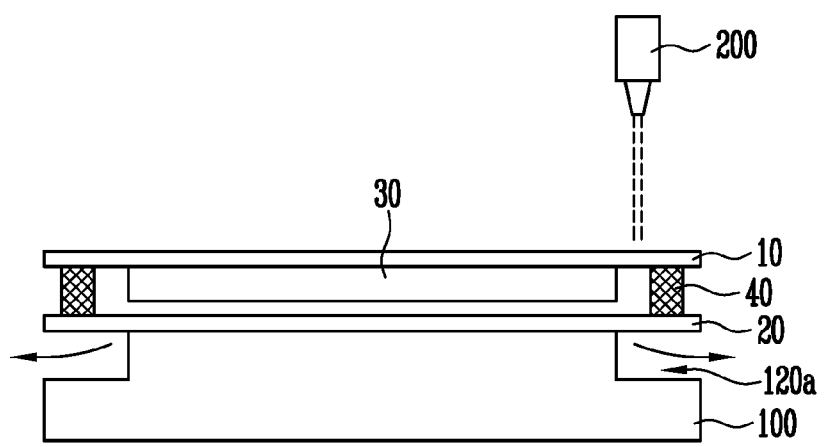

FIGS. 8 and 9 are sectional views illustrating exemplary embodiment of the sealing apparatus according to the invention.

Referring to FIGS. 8 and 9, the first and second substrates 10 and 20 having the sealant 40 interposed therebetween are mounted on the stage 100 of the sealing apparatus. When light is provided from the optical oscillator 300 to the optical head 200, the optical head 200 irradiates the light onto the sealant 40 while being moved along the four portions of the sealant 40 by the moving unit 400.

When the light, such as laser and infrared light, for example, is consecutively irradiated onto the four portions of the sealant 40, the sealant 40 is melted by heat and bonded to the first and second substrates 10 and 20. In such an embodiment, the heat generated by the light may be effectively discharged to an outside of the stage 100 by air circulated through the first concave portion 120, the second concave portion 120a and/or the ventilating openings 140.

In an exemplary embodiment, where the stage 100 the concave portion 120a having a step shape including an opened side, the heat generated by the light may be substantially effectively discharged to an outside of the stage 100 through the opened side. In an exemplary embodiment, where the stage 100 includes the concave portion 120 having opposing sidewalls, e.g., the inner side wall 122 and the outer side wall 126, the stage may substantially stably support the first and second substrates 10 and 20 disposed thereon. In an exemplary embodiment, where the ventilating openings 140 is defined in the outer sidewall 126 of the concave portion 120 of the stage 100, air circulation is thereby substantially enhanced.

In a conventional sealing apparatus, where the concave portions 120 and 120a are not provided in the stage 100, the entire surface of the first or second substrate 10 or 20 may be adhered substantially closely to the stage 100. In such sealing apparatus, when the light is consecutively irradiated onto the sealant 40, the temperature of the substrate disposed substantially closely to the stage 100 is increased higher a temperature the opposing substrate, which is exposed to the air, such that the bonding between the sealant 40 and the substrates 10 and 20 may be deteriorated due to thermal impact or remaining stress caused by an asymmetric temperature difference. When the bonding between the sealant 40 and the substrates 10 and 20 is deteriorated, the sealant 40 may be easily separated, or the bonding interface between the sealant 40 and the substrates 10 and 20 may be damaged. Therefore, the sealing of the display device may be destructed.

In an exemplary embodiment of the invention, heat generated by the light is effectively discharged to the outside of the stage 100 by the air circulated through the first concave portion 120, the second concave portion 120a and/or the ventilating openings 140, such that the temperature of the substrate (e.g., the second substrate 20) disposed closely to the stage 100 is maintained substantially similar to the temperature of the opposing substrate (e.g., the first substrate 10) exposed in the air. As a result, in such an embodiment, an asymmetric temperature difference may not occur or may be effectively minimized, and the thermal impact or remaining stress is thereby minimized by the substantially uniform temperature distribution, such that the bonding between the sealant 40 and the substrates 10 and 20 may be effectively performed.

Hereinafter, an exemplary embodiment of a method for fabricating a display device using a sealing apparatus according to the invention will be described with reference to FIGS. 10A to 10D.

FIGS. 10A to 10D are sectional views illustrating an exemplary embodiment of a method for fabricating a display device using the sealing apparatus according to the invention.

Figure 10A:
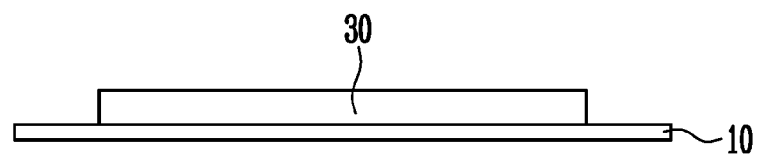
FIGS. 10A to 10D are sectional views illustrating an exemplary embodiment of a method for fabricating a display device using the sealing apparatus according to the invention.

Referring to FIG. 10A, a pixel array 30 is provided, e.g., formed, on the first substrate 10. In an exemplary embodiment, the first substrate 10 may include a transparent insulative material such as glass or plastic, for example.

In such an embodiment, the pixel array 30 includes a plurality of pixels arranged substantially in a matrix form and connected to a plurality of scan lines and a plurality of data lines, which are disposed in the pixel array 30. In one exemplary embodiment, for example, the pixels may be disposed between the scan lines and the data lines. Each pixel may include an organic light emitting diode. The organic light emitting diode includes an anode electrode, a cathode electrode, and an organic thin film layer disposed between the anode and cathode electrodes. The organic thin film layer includes organic layers such as a hole transport layer, an organic emissive layer and an electron transport layer, for example.

The pixel may further include a transistor configured to control an operation of the organic light emitting diode, and a capacitor configured to maintain a signal.

Figure 10B:
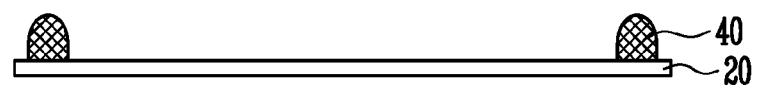

Referring to FIG. 10B, a sealant 40 is provided, e.g., formed, on a side portion (e.g., the four side portions) of a second substrate 20 to surround the pixel array 30. The second substrate 20 may include a transparent insulative material such as glass or plastic, for example, and the sealant 40 may include frit, for example.

In one exemplary embodiment, for example, frit in a paste state may be applied along an edge of the second substrate 20, for example, using a screen printing method. The frit may include an organic binder and a filler for decreasing a thermal expansion coefficient thereof, for example. In such an embodiment, the sealant 40 may be formed when moisture or organic binder is removed by firing the applied frit.

Figure 10C:
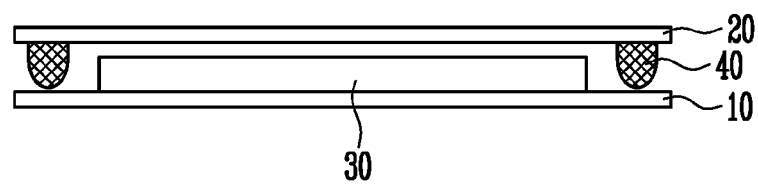

Referring to FIG. 10C, the first and second substrates 10 and 20 are disposed opposite to each other. Then, the first and second substrates 10 and 20 are joined together such that the pixel array 30 is surrounded by the sealant 40.

Referring back to FIG. 8 or 9, the first and second substrates 10 and 20 are disposed, e.g., mounted, on the stage 100, in which the concave portions 120 and 120a are defined to correspond to the sealant 40. Then, light is irradiated onto the sealant 40 by moving the optical head 200 along the sealant 40 above the stage 100.

Figure 10D:
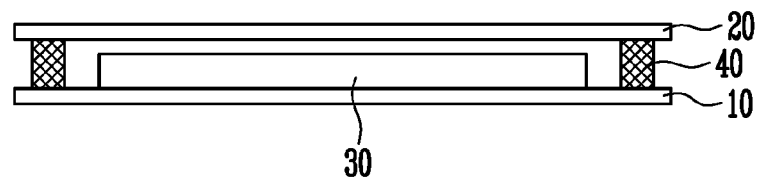

Referring to FIG. 10D, when the light is consecutively irradiated along the sealant 40 as described above, the sealant 40 is melted by heat and bonded to the first and second substrates 10 and 20. The sealant 40 is bonded to the first and second substrates 10 and 20, thereby effectively sealing a space surrounded by the sealant 40 between the first and second substrates 10 and 20.

In exemplary embodiments of the invention as described herein, the concave portions 120 and 120a corresponding to the sealant 40 are defined in the stage 100. In such an embodiment, when heat is generated by the light irradiated onto the sealant 40, the heat may be effectively discharged to the outside of the stage 100, by air circulated through the concave portion 120, the concave portion 120a and/or the ventilating openings 140, such that the temperature of the substrate (e.g., the second substrate 20) adhered closely to the stage 100 is maintained substantially similar to the temperature of the opposing substrate (e.g., the first substrate 10) exposed in the air, and a substantial asymmetric temperature difference does not occur. Accordingly, in such an embodiment, the thermal impact or remaining stress is effectively minimized by substantially uniform temperature distribution, such that the bonding between the sealant 40 and the substrates 10 and 20 may be effectively performed.

The invention should not be construed as being limited to the exemplary embodiments set forth herein. Rather, the exemplary embodiments are provided so that this disclosure will be thorough and complete and will fully convey the concept of the invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A sealing apparatus for sealing a first substrate and a second substrate by a sealant, the sealing apparatus comprising:
   a stage which supports the first and second substrates, wherein the sealant is interposed between the first and second substrates along edges of the first and second substrates, and the stage comprises a concave portion defined to correspond to the sealant; and
   an optical head configured to irradiate light onto the sealant,
   wherein the concave portion comprises an inner sidewall, an outer sidewall, a bottom surface extending from the inner sidewall, and a plurality of ventilating openings defined in the outer sidewall, the concave portion overlaps the first and second substrates, and
   heat generated by the light irradiated onto the sealant is discharged to the outside at a periphery defining the stage by air circulated through the concave portion.

2. The sealing apparatus of claim 1, further comprising:
   a moving unit configured to move the optical head along the sealant.

3. The sealing apparatus of claim 1, further comprising:
   an optical oscillator configured to provide the light to the optical head.

4. The sealing apparatus of claim 1, further comprising:
   a mask disposed between the stage and the optical head, wherein the mask comprises a transmitting portion defined therein to correspond to the sealant.

5. The sealing apparatus of claim 1, wherein the sealant comprises frit.

6. The sealing apparatus of claim 1, wherein the light is laser or infrared light.

7. The sealing apparatus of claim 1, wherein the entire inner sidewall extends in a straight line from the bottom surface.

8. The sealing apparatus of claim 1, wherein the periphery defining the stage is substantially perpendicular to the bottom surface and substantially parallel to the inner sidewall.

9. A sealing apparatus for sealing a first substrate and a second substrate by a sealant, the sealing apparatus comprising:
   a stage which supports the first and second substrates, wherein the sealant is interposed between the first and second substrates along edges of the first and second substrates, and the stage comprises a concave portion defined to correspond to the sealant; and
   an optical head configured to irradiate light onto the sealant,
   wherein the concave portion is defined by at least an inner sidewall and a bottom surface extending from the inner sidewall, and
   heat generated by the light irradiated onto the sealant is discharged to the outside at a periphery defining the stage by air circulated though the concave portion, wherein
   the sealant comprises four portions corresponding to four sides of the first and second substrates,
   a portion of the concave portion corresponding to two opposing portions of the sealant comprise the inner sidewall and an outer sidewall, and
   a portion of the concave portion corresponding to the other two opposing portions of the sealant is in a step shape having an opened sidewall, and
   wherein a plurality of ventilating openings is defined in the outer sidewall of the portion of the concave portion corresponding to the two opposing portions of the sealant.

* * * * *